United States Patent [19]

Queniat et al.

[11] Patent Number: 5,383,208
[45] Date of Patent: Jan. 17, 1995

[54] DEVICE AND METHOD TO CONTROL THE OUTPUT POWER OF LASER DIODES

[75] Inventors: Jean-François Queniat, Trebeurden; Andre Jaillard, Lannion, both of France

[73] Assignee: France Telecom, Paris, France

[21] Appl. No.: 99,842

[22] Filed: Jul. 30, 1993

[30] Foreign Application Priority Data

Jul. 30, 1992 [FR] France ................ 92 09487

[51] Int. Cl.⁶ .............................................. H01S 3/13
[52] U.S. Cl. ...................... 372/29; 372/34; 372/38; 372/43; 372/109; 372/50
[58] Field of Search .............. 372/9, 18, 20, 29, 30, 372/31, 32, 33, 34, 38, 36, 43, 46, 50, 108, 109; 250/205; 369/116, 121; 346/76 L

[56] References Cited

U.S. PATENT DOCUMENTS

| | | | |
|---|---|---|---|
| 4,700,057 | 10/1987 | Sakai | 250/205 |
| 4,700,058 | 10/1987 | Belanger et al. | 250/205 |
| 4,769,532 | 9/1988 | Kawakami | 250/205 |
| 4,907,236 | 3/1990 | Shimada | 372/31 |
| 4,985,896 | 1/1991 | Kimizuka et al. | 372/38 |
| 4,995,105 | 9/1991 | Wechsler | 372/38 X |
| 5,019,769 | 5/1991 | Levinson | 372/31 |
| 5,163,063 | 11/1992 | Yoshikawa et al. | 372/38 |
| 5,185,643 | 2/1993 | Vry et al. | 372/32 X |
| 5,274,622 | 12/1993 | Kono | 369/116 |
| 5,313,482 | 5/1994 | Zelenka et al. | 372/38 |
| 5,317,578 | 5/1994 | Ogou | 372/38 X |

FOREIGN PATENT DOCUMENTS

| | | | |
|---|---|---|---|
| 0061034 | 9/1982 | European Pat. Off. | 372/38 X |
| 0396371 | 11/1990 | European Pat. Off. | 372/38 X |
| 0421674 | 4/1991 | European Pat. Off. | 372/38 X |
| 0497431 | 8/1992 | European Pat. Off. | 372/31 X |
| 59-054280 | 12/1984 | Japan | 372/31 X |
| 60-251731 | 12/1985 | Japan | 372/31 X |
| 63284684 | 2/1986 | Japan | 372/31 X |
| 1133384 | 5/1989 | Japan | 372/31 X |

Primary Examiner—Brian Healy
Attorney, Agent, or Firm—Nilles & Nilles

[57] ABSTRACT

A device for the control of the output power of laser diodes designed to be coupled to an optical fiber for the tranmission of data comprises a photodiode that can be used to acquire a characteristic signal of the power emitted by the laser diode; digital means to drive the laser diode comprising a central processing unit associated with servo-control computation program memorizing means to keep a constant output power whatever may be the drift and change of slope of the characteristic of the laser diode in response to ageing phenomena or to a change in temperature or to a loss of power due to the coupling of this diode with an optical fiber or to variations in the response of the photodiode as a function of the temperature. Application to digital transmission by optical fiber.

17 Claims, 7 Drawing Sheets

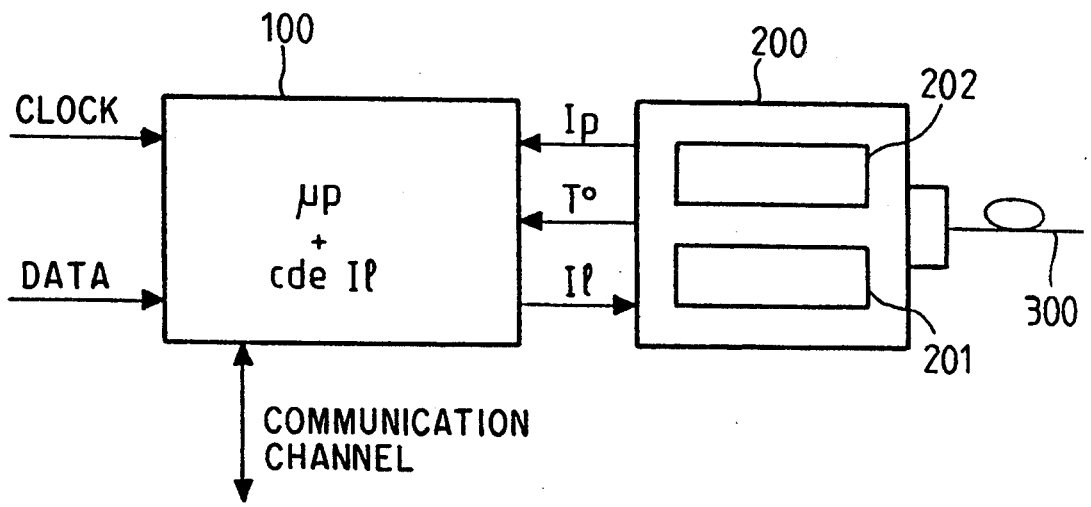
FIG_1
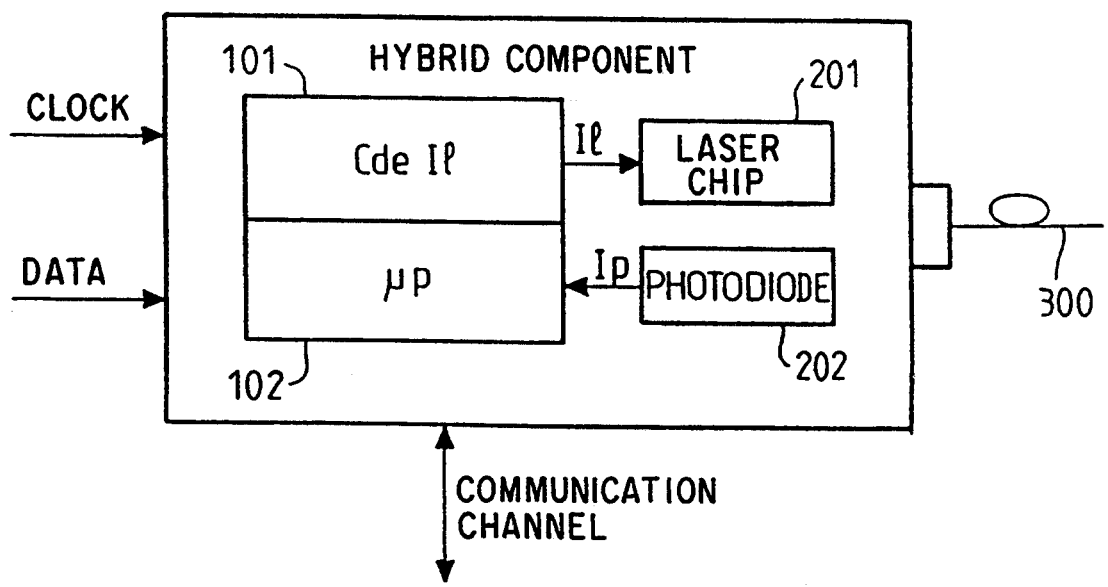
FIG_2

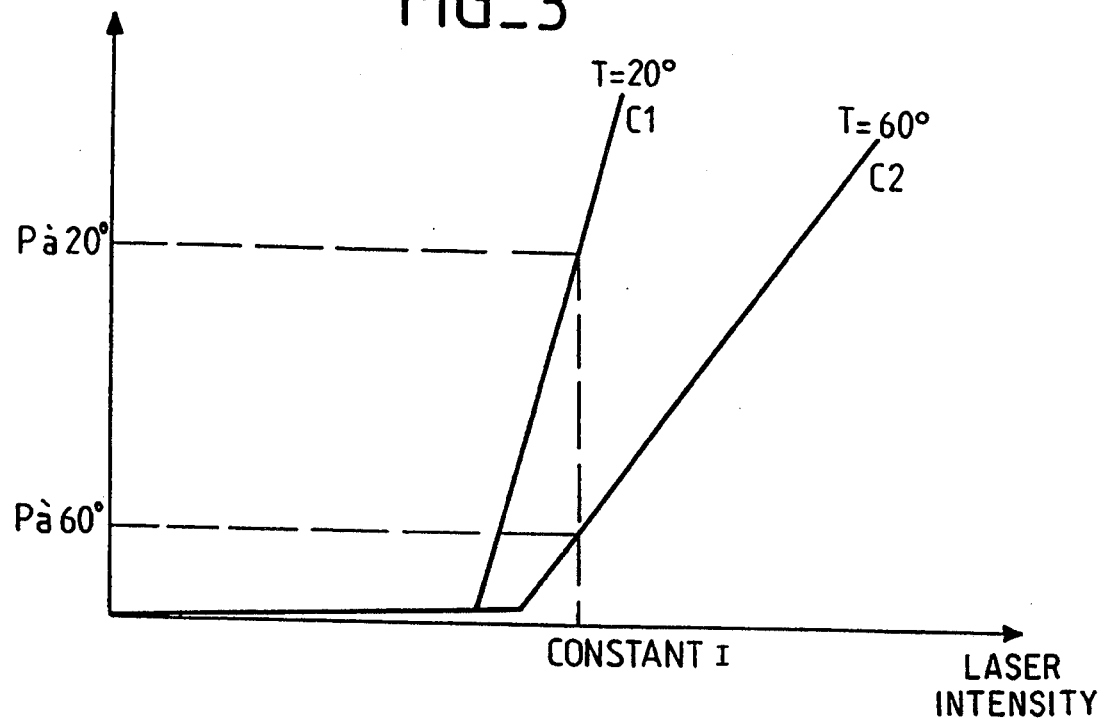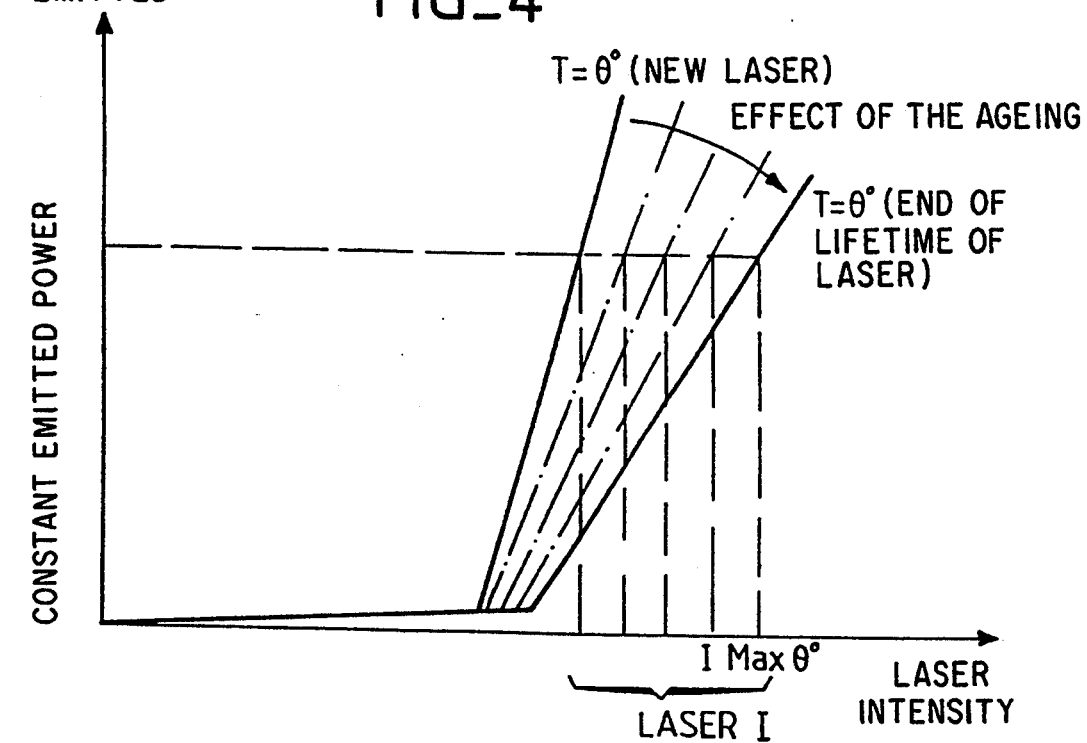

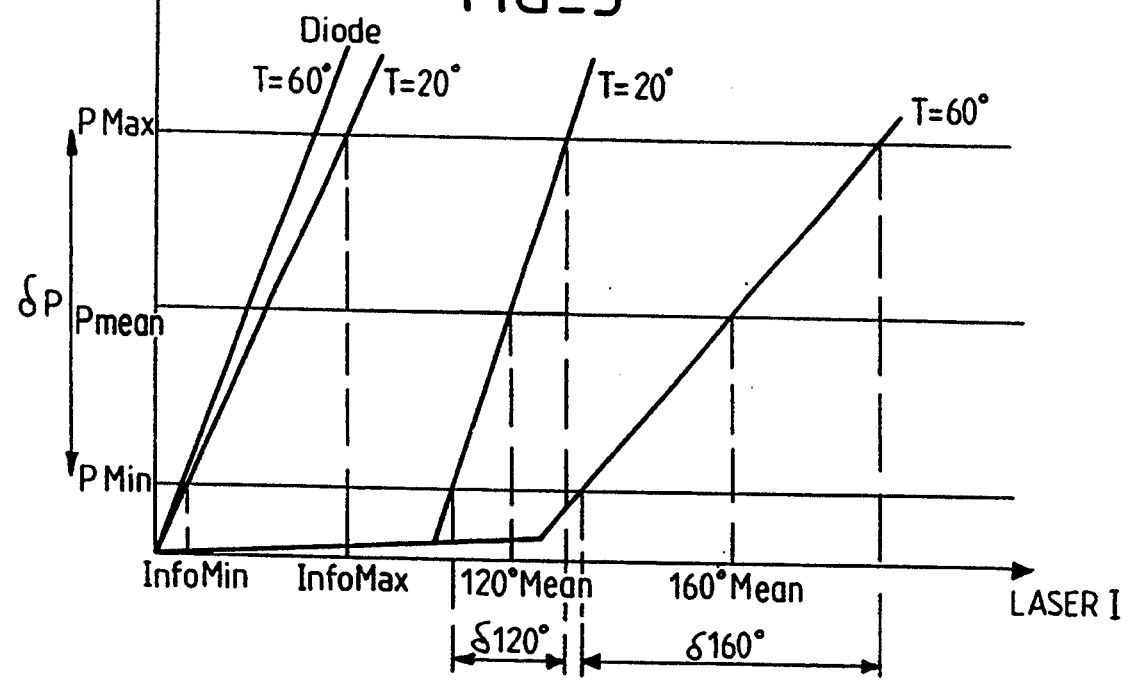
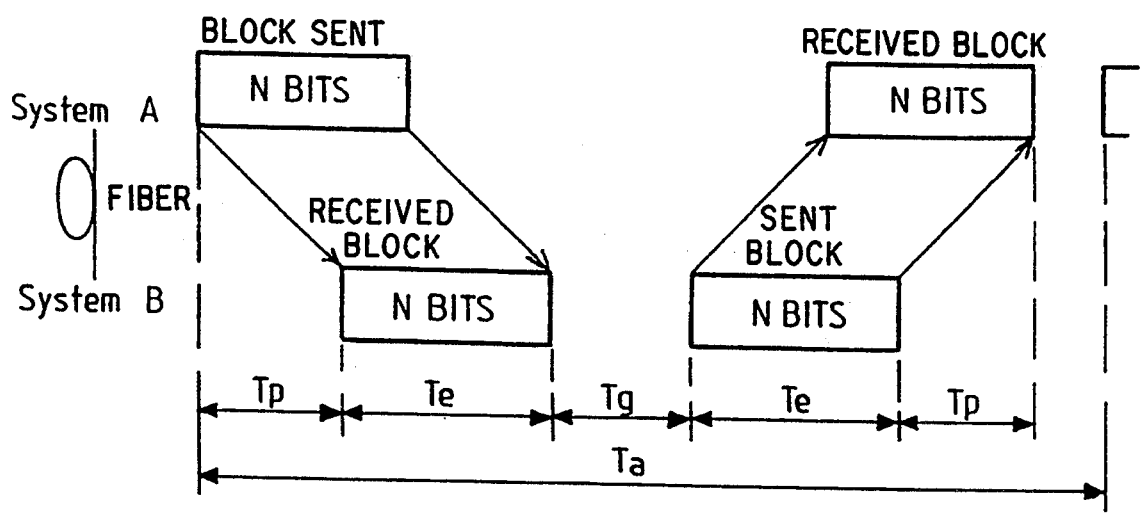

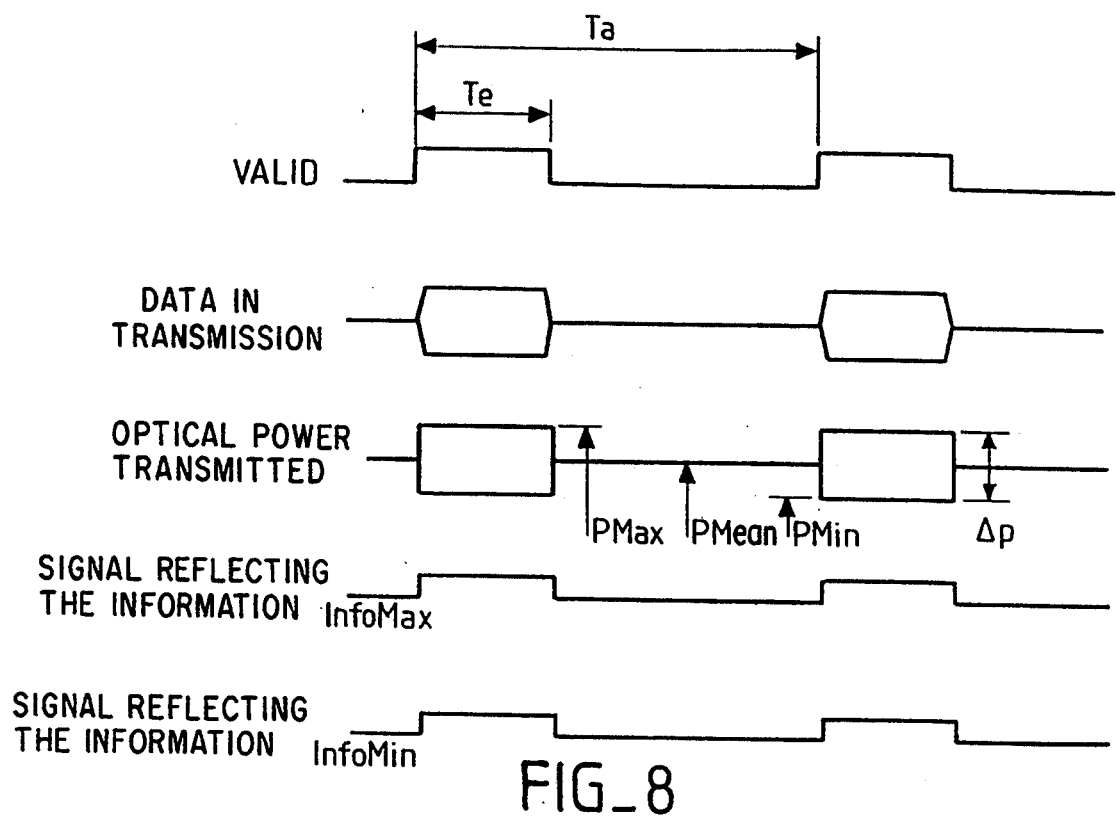
FIG_8
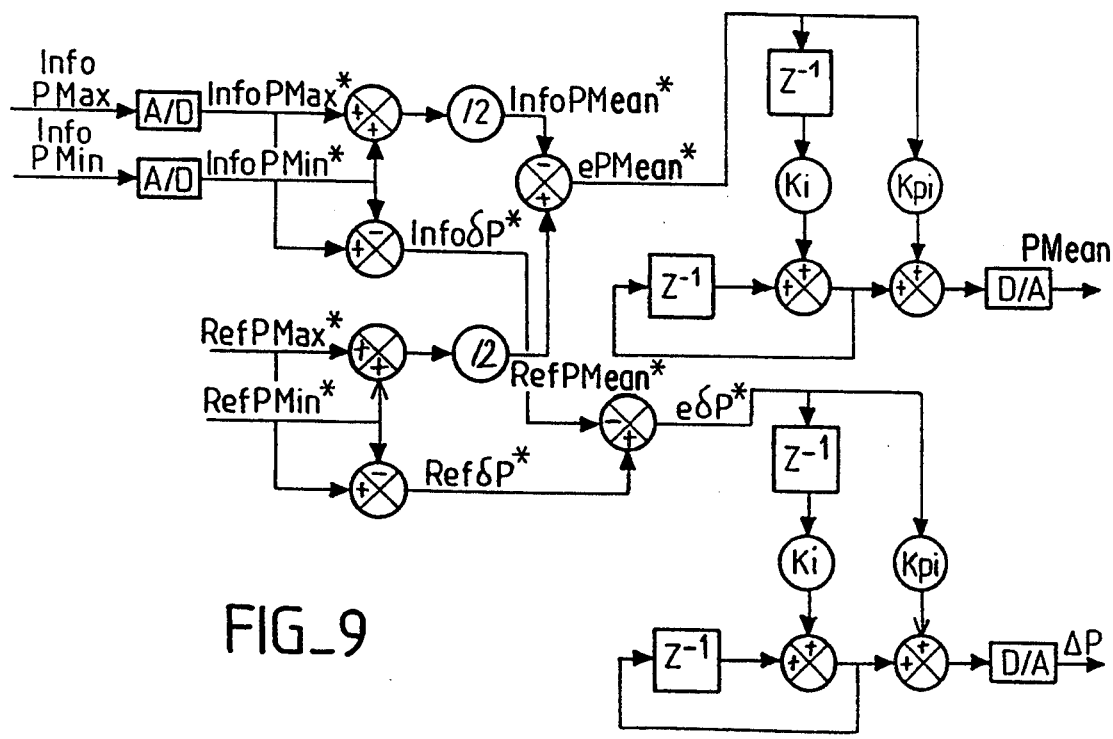
FIG_9

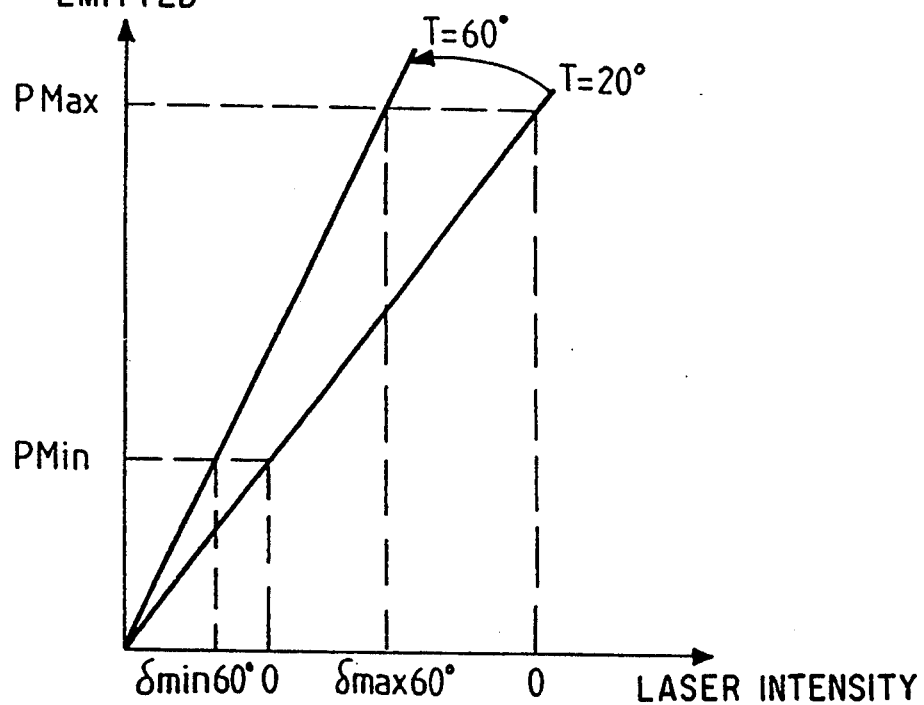
FIG_10
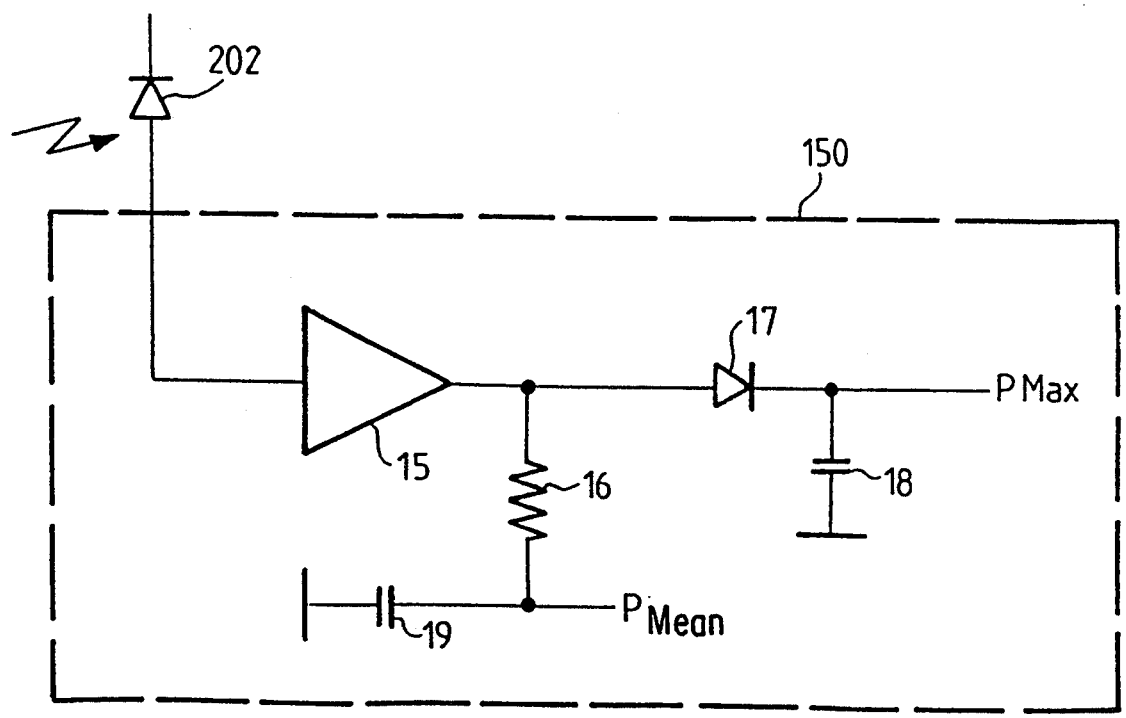
FIG_11

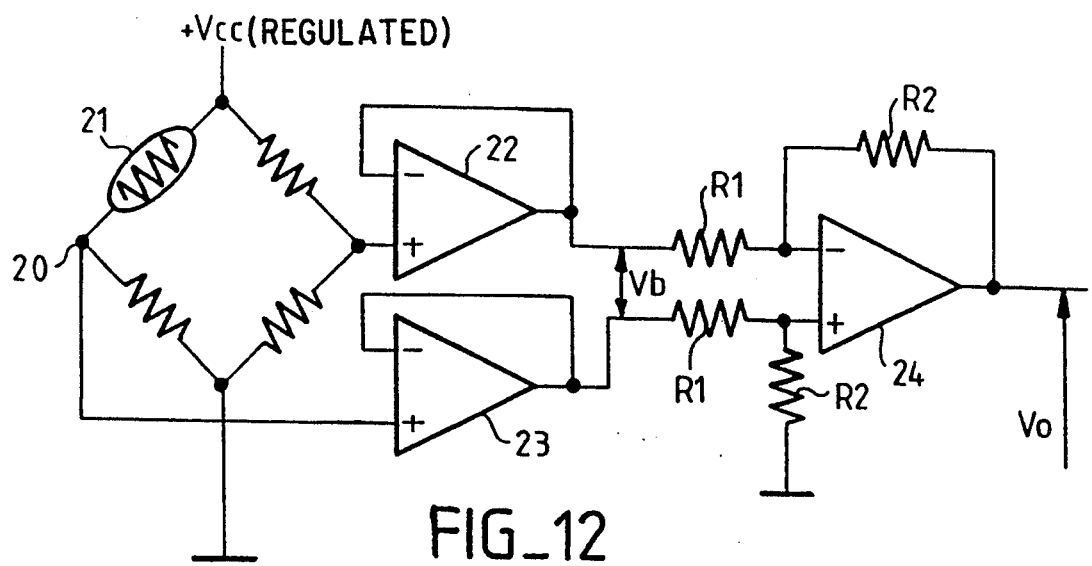
FIG_12
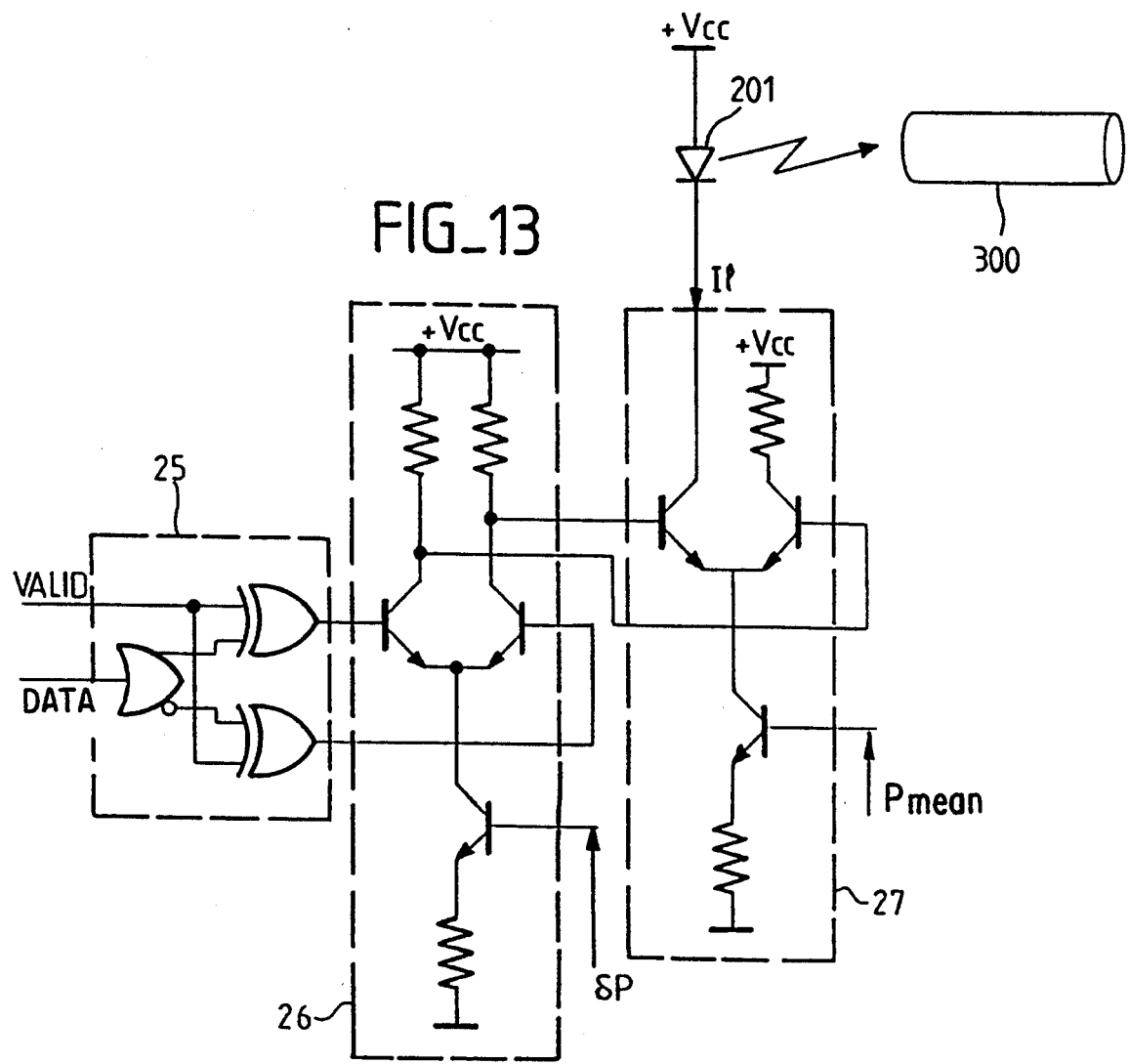
FIG_13

DEVICE AND METHOD TO CONTROL THE OUTPUT POWER OF LASER DIODES

BACKGROUND OF THE INVENTION

1. Field of the Invention

The invention relates to a device for controlling the output power of laser diodes likely to be coupled to an optical fiber for the transmission of digital signals on optical fibers.

Laser diodes are widely used in the field of digital transmissions on optical fibers, but have the drawback of showing major variations of the luminous power emitted in response to a change in temperature or an ageing of the diode.

The diagrams of FIGS. 3 and 4 can be referred to for a clearer understanding of these phenomena.

FIG. 3 shows the variations of the characteristic curve of a laser as a function of the temperature. For a temperature T=20° C., the curve C1 is obtained and for a temperature T=60° C., the curve C2 is obtained. It is thus observed that, for a constant supply current I, the optical power emitted when the temperature is equal to 20° C. is greater than the optical power emitted when the temperature is equal to 60° C.

FIG. 4 shows two characteristic curves of laser diodes, one of which corresponds to a new laser diode and the other to a laser diode at the end of its lifetime. These characteristic curves have been plotted for a constant temperature equal to Θ °C.

It can also be seen in this FIG. 4 that the optical power emitted is weaker for a given current I when the laser is at the end of its lifetime.

2. Background of the Invention

There is a regulation method used to compensate for the variations in the output power emitted by the diode laser that are due to a variation of the temperature. This method consists in carrying out an analog regulation of the luminous power emitted by a laser diode by comparing a signal representing said power with a reference signal to obtain an error signal that is used to modify the electrical supply current of the laser diode.

It has been observed that this method has the drawback of very low efficiency when the sending out of the data is periodic. Indeed, the loop which achieves a continuous regulation is found wanting for, as a representative signal, it uses a signal representing the sporadic power emitted.

Another known method consists solely of a temperature regulation. The regulation is done by cooling by means of a Peltier effect element controlled by a negative feedback loop, the input signal of which is constituted by the difference between the measured temperature of the laser and an instructed value of temperature. This servo-control system has the drawback of being costly and of consuming a great deal of energy, and of not taking account of the drift due to the ageing of the laser.

There also exist systems that foresee the end of the lifetime of the laser diode. These systems have a regulation arrangement to overcome the effects of variation due to the ageing of the diode, and also an active element to keep the operating temperature constant. Thus, the maximum current I indicating the end of the lifetime of the laser takes a fixed value, depending on the operating temperature which is kept constant. The diagnosis then amounts to a simple comparison of the value of the supply current of the laser with the value of current Imax that was fixed beforehand. A rudimentary system such as this remains costly and consumes a great deal of energy.

Apart from these drawbacks, the present applicant has also observed that there is a loss of optical power due to the coupling of the laser diode with the optical fiber, and that there is no system, at present, that enables total mastery to be achieved over this phenomenon. The applicant has also observed that the element which enabled the image of the information to be retrieved, generally a photodiode on the rear face of the laser, is generally disturbed by a change in temperature and that, consequently, the signal representing the luminous power emitted, is also subjected to variations due the variations in temperature. No existing regulation system enables this phenomenon to be taken into account.

SUMMARY OF THE INVENTION

The present invention is aimed at overcoming all these problems.

An object of the invention, more particularly, is a device to control the output power of the laser diodes capable of being coupled to an optical fiber, comprising:
- a photodiode that can be used to acquire a characteristic signal of the power emitted by the laser diode;
- digital means to drive the laser diode;
- program memorizing means;
- parameter memorizing means;
- a communications channel.

The device may comprise a temperature sensor if necessary. The digital means for the driving of the diode are capable of receiving and processing the characteristic signal to give a current drive signal so as to maintain a constant luminous output power of the laser diode, these means comprising a central processing unit associated with servo-control computation program memorizing means, keeping a constant output power whatever may be the drift and change of slope of the characteristic of the laser diode in response to ageing phenomena or to a change in temperature or to a loss of power due to the coupling of this diode with an optical fiber or to variations in the response of the photodiode as a function of the temperature.

The program memorizing means are also loaded with an alarm management program that can be used to trigger alarms upon the detection of an operating anomaly. The parameter memorizing means are loaded with characteristic parameters of the laser diode, alarm parameters and fiber coupling parameters that are determined beforehand.

The communications channel enables the processing unit to send information elements to and/or receive information elements from a management center.

According to another aspect of the invention, the device can be made in the form of a component in which the driving means are formed by a single integrated circuit chip on a substrate according to a biCMOS technology.

According to another aspect of the invention, the device may be made in the form of a hybrid component in which the driving means, the laser diode and the photodiode are formed by integrated circuit chips on distinct substrates.

BRIEF DESCRIPTION OF THE DRAWINGS

Other features and advantages of the invention shall appear clearly in the following description, given on a non-restrictive, exemplary basis with reference to the appended drawings, of which:

FIG. 1 shows a drawing of the device according to a first embodiment;

FIG. 2 shows a drawing of the device according to a second embodiment;

FIG. 3 shows two response curves of a laser diode as a function of the variations in the temperature;

FIG. 4 shows two response curves of a laser diode at the beginning and end of its lifetime;

FIG. 5 shows response curves of a laser diode as a function of the temperature variations and of the photodiode giving the characteristic signal of the power emitted by the laser diode, also as a function of the temperature variations;

FIGS. 7 and 8 show a timing diagram illustrating a mode of transmission in alternation between a system A and a system B;

FIG. 9 shows the structural diagram of the servo-control computation according to the invention;

FIG. 10 is used to illustrate the power differences as a function of temperature on the response curve of a laser diode;

FIG. 11 shows an exemplary embodiment of the circuit 150;

FIG. 12 shows an exemplary embodiment of the circuit 158;

FIG. 13 shows an exemplary embodiment of the circuit 152.

DESCRIPTION OF PREFERRED EMBODIMENTS

Figure 6:
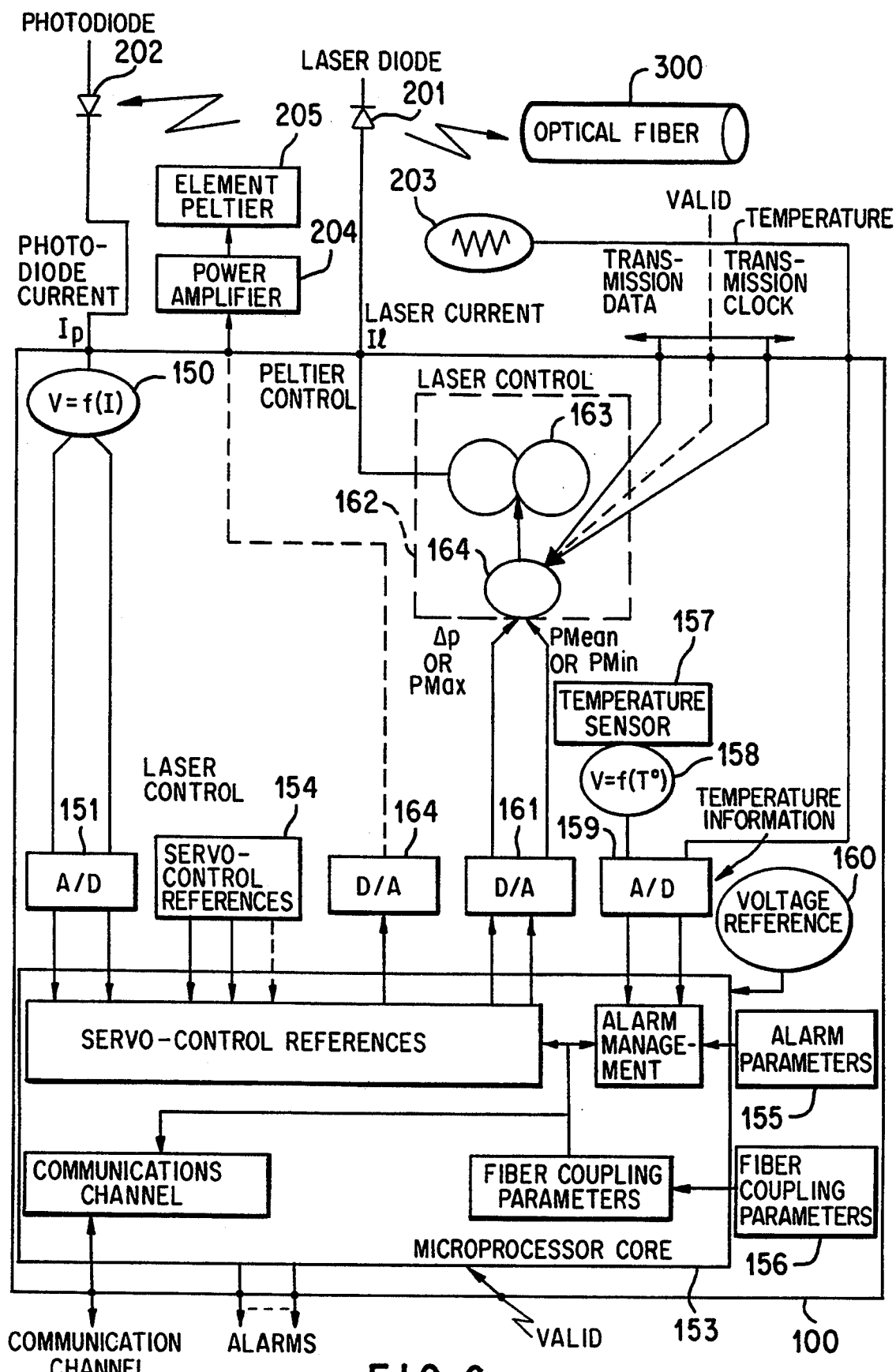
FIG. 6 shows a functional diagram of the device according to the invention.

The device for the control of the output power of laser diodes liable to be coupled to an optical fiber may be made, as already mentioned, in the form of a monochip or hybrid component as the case may be.

FIG. 1 illustrates a monochip component. The component has digital driving means made by means of a microprocessor core and peripherals, such as analog-digital-analog converters, a temperature sensor, ROM, Flash EPROM or EEPROM type memories and a current drive for the laser head.

The monochip component bearing the reference 100 in FIG. 1 will therefore be liable to carry out the function of digital driving of a laser head mounted in a hybrid component 200. The component has one input to receive a clock signal, one transmission data input, one input to receive a characteristic signal of the power emitted by the laser head, one input to receive the temperature prevailing around the laser head, one output corresponding to the laser head modulation current, and one interface towards a communications channel enabling an operating system or a monitoring system to be connected through this communications channel to the components and to monitor the component and, possibly, to modify parameters recorded in an electrically erasable non-volatile memory.

FIG. 2 corresponds to the schematic diagram of an alternative embodiment of a device such as this wherein a microprocessor 102, a current drive 101, the laser chip 201 and the photodiode 202 are brought together in a hybrid type component. The component also has a clock input, a data input and a link with the switch-over channel. Naturally, in both variants, coupling means that are standard per se enable an optical fiber 300 to be coupled to the laser chip so that the power emitted by the laser head is transmitted by the fiber.

The diagram of FIG. 6 is a functional diagram of the device according to the invention. The component 100 enables a current drive signal to be given to the laser diode 201 which sends signals, under the control of the component, to the optical fiber 300 which is at constant power.

The photodiode supplies the component with a current that is characteristic of the power emitted by the laser diode.

A circuit 150 is used to obtain a function $V=f(I)$ so as to obtain two information elements on emitted power from the current IP, namely the maximum power and the minimum power or the peak power and the mean power. Hereinafter in the description, the terms PMax and PMin shall be used to designate maximum power and the minimum power respectively, and PPeak, PMean shall be used to designate the peak power and the mean power respectively. These two information elements are applied to the inputs of the analog/digital converter 151 which transmits them, after digitization, to the microprocessor 153. The microprocessor furthermore receives a set of parameters and, especially, servo-control parameters, alarm parameters and fiber coupling parameters that come respectively from memory zones 154, 155 and 156 of an EEPROM or Flash EPROM type memory.

A temperature sensor 157 is planned in order to provide an information element on the ambient temperature. This information element is converted by a circuit 158 which enables the obtaining of the function $V=f(T)$, namely the obtaining of a voltage as a function of the temperature. This voltage is applied to the input of an analog/digital converter 159 which transmits the digitized temperature signal to the microprocessor 153. This function is active when the laser diode and the control circuit are located in a same hybrid circuit. This same converter, through an input of the circuit 100, can also receive another information element on temperature, namely external temperature, which may be given by a temperature sensor 203 placed in the vicinity of the laser diode. This function is active when the laser diode and the control circuit are located in two distinct components.

There is also provision for a circuit 160 used to supply a voltage reference to the various analog/digital converters, it being possible for this circuit to be made in a manner that is standard per se.

The microprocessor 153 and the different programs that perform the servo-control computation, the management of the alarms and the correction of the fiber coupling, which are loaded in a ROM or EEPROM or Flash EEPROM used to provide signals for adjusting the maximum and minimum current levels of the laser current and the mean level of this current.

The microprocessor 153 gives two information elements on power to be emitted. These information elements may be either the power values PMax and PMin or δP and Pmean, δP being a difference between PMax and PMin.

A digital/analog converter 161 converts these information elements on power into analog signals which are applied to the inputs of a current drive circuit 162 of the laser diode.

This laser drive circuit 162 has a current source 163 and an upline circuit to modulate the current of the laser diode as a function of the transmission data elements.

The device may also include means 204, 205 for the regulation of the temperature by Peltier effect controlled by the processing unit 153. The signal is given by the unit 153, converted by the digital-analog amplifier 164 and applied to a power amplifier 204 which transmits it to the Peltier element 205.

Hereinafter, for a clearer understanding of the invention, a description shall be given of the working of a circuit such as this, applied to a system of alternating digital transmission on optical fiber.

It may be recalled that the alternation is actually a time-division multiplexing of both directions of transmission. This transmission system is used to give the perfect illusion of a duplex mode integral to the user. In each direction, the digital information to be transmitted is memorized temporarily and then cut up into blocks and sent alternately. The term "Ping Pong" transmission is sometimes used. The instantaneous flow rate of the transmission of the information element into a block should be greater than twice the real flow rate of the resultant digital channel to be transmitted in order to compensate for the effect of the propagation times in each direction. For a clearer understanding, reference may be made to the drawing of FIG. 7 which illustrates the principle of the alternation. A transmission by optical fiber is achieved between a system A and a system B. The duration Tp corresponds to the propagation time taken, in the fiber, to go from the system A to the system B and vice versa.

The duration Te corresponds to the time taken to send the data block.

The duration Tg corresponds to the standby time of the remote system.

The duration Ta corresponds to the cycle time of the system.

It is noted that the transmission of data from the system A to the system B is done during the period Te″, this being done during the period Ta″ as shown in FIG. 8. To make it easier to set up the receiver, the power sent by the transmitter may be done at three levels:

PMax for a "binary 1" level,
PMin for a "binary 0" level,
PMean when there is no data element.

According to the exemplary embodiment that is described, the photodiode 202 enables the component to prepare two information elements reflecting the maximum level of power (value corresponding to the sending of a data element in the state 0) and the minimum power level (value corresponding to the sending of a data element in the low state) emitted by the laser in the form of an analog voltage as shown in FIG. 6.

The element chosen is preferably a photodiode having a response curve that varies very little with the operating temperature, it being possible however for this variation to be modelized and recorded in the memory in the form of a table of values of points of the characteristic curve Y=f(T).

The diode laser enables the system to be controlled at two levels so that it is possible to adjust the levels PMean (mean power) and δP (maximum power — minimum power) coming out of the laser.

According to the exemplary application that has been taken, an information block is sent during "Ta" and this is done every "Ta" with, quite naturally Te<Ta. A VALID signal frames the transmission data (the VALID signal is in the state 1 during Te″). The laser diode is servo-controlled in such a way that it emits constant power levels in the course of time. The level PMean is sent when there are no data elements. The images of the information elements PMax and PMin produced by the photodiode are available only during the transmission of the data elements (Cf. FIG. 8).

The signal VALID is used to interrupt the microprocessor which can then convert the available information elements of the photodiode to use them in the servo-control algorithm loaded in the program memory.

The structural diagram of this algorithm is shown in FIG. 9. The principle of the algorithm is based on the use of two proportional-integral discrete regulators to enable the controlling of the laser diode in terms of PMean and δP.

The discrete regulator prepares a discrete control quantity as a function of the difference in discrete adjustment obtained between the information resulting from the photodiode and a fixed reference with a well-defined value. This regulator is a combination of a proportional regulator and an integrating regulator. The function that it fulfils may be defined from the basic relationship given here below in which u*(k) is the discrete control quantity and e*(K) is the discrete adjustment divergence:

$$u^*[K] = x^*[k-1] + K_{pi}e^*[k]$$
$$\text{avec } x^*[k-1] = K_i \sum_{j=0}^{k-1} e^*[j]$$
$$= x^*[k-2] + K_i e^*[k-1]$$

In this relationship, the asterisk means that the values are discrete values (of samples), k corresponds to the numbers of samples, K to the proportional factor, j to the index of variation of the samples.

In the drawing of FIG. 9, the blocks bearing the reference A/D are analog/digital converters, the blocks bearing the indications "+" or "−" are adders/subtractors, the blocks bearing a fraction bar are dividers, the blocks bearing a factor $K_i$ or $Kp_i$ are multipliers, the blocks bearing the reference $z^{-1}$ introduce delays into the samples.

The discrete control values that are prepared according to this example are:
InfoPMax and InfoPmin
The discrete adjusting differences are PMean and δP.
The adjusting algorithm that is implanted in the microprocessor is therefore the following:
Acquisition of the information elements InfoPMax and InfoPMin
Evaluation of the command PMean

---

InfoPMean=(InfoPMax+InfoPMin)/2
RefPMean=(RefPMax+TabMax (T°)+RefPMin+TabMin(T°))/2
eOldPMean=ePMean
ePMean=RefPMean−InfoPMean
PMean=Kpi.ePMean+OldPMean
OldPMean=eOldPMean+Ki.eOldPMean

---

Evaluation of the command δP:

---

InfoδP=InfoPMax−InfoPMin,
RefδP=RefPMax+TabMax(T°)−RefPMin+TabMin(T°)
eOldδP=eδP
eδP=RefδP−InfoδP
δP=Kpi.Eδp+OldδP $$\text{Old}\delta P = \text{Old}\delta P + K_i.e\text{Old}\delta P$$

The reference Old signifies the former value for a given information element, for example eOldPMean signifies the former value of the divergence of ePMean.

According to the invention, the variations of the slope of the characteristic curve of the photodiode as a function of the operating temperature of the laser are taken into account. For this purpose, we consider the references RefPMax and RefPMin which are variable as a function of the temperature in the algorithm. Naturally, this characteristic curve which has been shown in FIG. 5 and will be in the form of a table loaded in the memory will have been modelized beforehand.

Indeed, if a temperature of 20° is taken as the starting point, a laser working at 60° must have a correction of $\delta$Max60° for REfPMax and $\delta$Min60° for RefPMin as can be seen in FIG. 9. Knowing the drift of the slope as a function of the temperature for each laser head, a correction table is prepared as a function of the temperature TabMax and TabMin. These tables may be loaded or remote-loaded through the communications channel, whenever the component is put into operation.

According to the invention, the alarm management program will make it possible to indicate the end of the lifetime of the laser which depends on its working temperature. To this end, an alarm will be triggered by the component when the current IMean sent to the laser exceeds a value IMaxMean which depends on the temperature contained in the table TabMax.

An alarm will be triggered to indicate a lack of power of the laser when the laser current IMean is lower than a value IMeanMin.

An alarm will be triggered to indicate an abnormal temperature of the laser when the measured temperature of the laser is greater than a value TempMax.

All the specific laser values used are loaded into the component or remote loaded through the communications channel when the component is put into operation.

The following is the algorithm corresponding to the generation of the alarms:

```
if IMean>temperature Max(T°)
  then alarm: end of laser life
end if
  then IMean<IMeanMin
  then alarm: lack of laser power
end if
if laser Temperature>TemperatureMax
  then alarm abnormal Temperature of the laser
end if
```

According to the invention, the program memory comprises a program to achieve a cut-off of the laser diode. The program consists in causing a minimum current to be sent to the laser head.

According to the invention, the program memory has a control program to determine the characteristic curve of the laser diode. The program consists in stopping the transmission of data, successively sending a constant current to the laser and recovering, through the photodiode, the power emitted by the laser. The results obtained are transmitted by the communications channel and enable the making of the characteristic curve of the laser.

FIG. 11 shows an exemplary embodiment of the circuit 150 used to obtain a function of the type V=f(I).

According to this example, the circuit 150 comprises a transimpedance amplifier 15. The output PMax of this amplifier 15 is taken at the terminals of a capacitor 18 through the passage of a diode 17. The output PMean is taken at the terminals of a capacitor 19 through the passage in a resistor 16.

FIG. 12 shows an exemplary embodiment of the circuit 158 that can be used to obtain a function of the type V=f(T°).

The circuit 158 according to this example has a Wheatstone bridge 20 including a thermistor 21. The voltage Vb obtained at the output of the two operational amplifiers 22 and 23 varies as a function of the temperature. A voltage Vo proportional to the voltage Vb is obtained at the output of this circuit. This voltage Vo is taken at the output of an operational amplifier 24 and is defined by the relationship VO=−Vb(R2/R1).

FIG. 13 shows an exemplary embodiment of the circuit 162.

This circuit has a logic circuit 25 and two differential pairs.

The first differential pair 26 can be used to adjust the level IMax−IMin of the current Il from $\delta$P. The second differential pair 27 enables the adjusting of the level IMean of this current Il from PMean.

Furthermore, this circuit 160 is used to obtain a voltage reference internally. This voltage reference is used for the analog-digital converters.

A voltage reference such as this can be obtained by means of a commercially available component.

Thus, according to the invention, the device comprises a driving element made by a microprocessor in which the ROM or EEPROM or Flash EPROM contains the program that can be used to manage all the different functions of the optical head:
  servo-control computation,
  management of the alarms (end of the lifetime of the laser, abnormally high temperature, lack of reception power, line cut-off etc.),
  cut-off of the laser,
  correction of the coupling to the fiber,
  management of the communications channel; the information elements stored in the Flash EPROM (or EEPROM) memory enable the individualizing of each laser head used. The fact that the Flash EPROM has the particular feature of keeping the information even when there is no power supply means that it is possible, in this way, to avoid reconfiguring the laser head after a cut-off in the power supply. The information elements stored will therefore be the following ones:
  servo-control references (to adjust the levels of luminous power at output of the laser);
  parameters of the fiber-laser coupling (this function having been modelized);
  parameters of the variation of the response curve of the photodiode as a function of the temperature;
  alarm parameters (triggering thresholds of the different alarms).

Provision may be made for choosing a Flash-EPROM of a fairly large capacity for the storage therein of the main program (apart from a small part corresponding to the booting) to enable updatings of the software through the communications channel.

What is claimed is:

1. A device to control the output power of a laser diode capable of being coupled to an optical fiber, comprising:
   a photodiode which acquires a characteristic signal of the power emitted by said laser diode; and
   a digital laser diode driver capable of receiving and processing said characteristic signal to give a current drive signal so as to maintain a constant luminous output power of said laser diode, said driver comprising memorizing means and a central processing unit associated with a servo-control computation program for carrying out a servo-control of the output power on the basis of two levels of power emitted by said laser diode and two levels of power given by the recorded characteristic parameters of said laser diode, maintaining a constant output power despite changes in drift and change of slope of said characteristic signal of said laser diode in response to aging phenomena or to a change in temperature or to a loss of power due to the coupling of said laser diode with an optical fiber or to variations in the response of the photodiode as a function of the temperature.

2. A control device according to claim 1, comprising program memorizing means to achieve a cut-off of the laser diode.

3. A control device according to claim 1, comprising control program memorizing means to determine the characteristic curve of the laser diode.

4. A control device according to claim 1, wherein the processing unit carries out a servo-control of the output power on the basis of two levels of power emitted by the laser diode and two levels of power given by the recorded characteristic parameters of the recorded laser diode.

5. A control device according to claim 1, comprising means for the acquisition of the two levels of power emitted by the laser diode and means for the analog/digital conversion of these two levels of power.

6. A control device according to claim 5, wherein the current drive signal corresponds to two output power levels, wherein the device furthermore comprises means for the supply of current to the laser diode comprising two inputs and digital/analog conversion means to convert the two output power levels and apply them to the current supply means.

7. A control device according to claim 1, comprising means to measure the ambient temperature prevailing around the laser diode and means for the analog/digital measurement of the measurements to be made in order to transmit them to the processing unit.

8. A control device according to claim 1, comprising means for the regulation of the temperature by Peltier effect controlled by the processing unit.

9. A control device according to claim 1, wherein the program memorizing means comprise a reading memory (ROM or EEPROM or Flash EEPROM), wherein the reference parameter memorizing means comprise an electrically erasable programmable memory (EEPROM).

10. A control device according to claim 1, wherein the processing unit comprises a microprocessor furthermore associated with a reading and writing working memory (RAM).

11. A control device according to claim 1, wherein the means for the acquisition of the two levels of power emitted comprises a transimpedance receiver.

12. A control device according to claim 6, wherein the current supply means comprise a differential amplifier connected at output to a current source.

13. A device according to claim 1, made in the form of an electronic component in which the driving means are formed by a single integrated circuit chip on a substrate according to a bi-CMOS technology.

14. A device according to claim 1, made in the form of a hybrid component in which the driving means, the laser diode and the photodiode are formed by integrated circuit chips on distinct substrates.

15. A method of servo-controlling the output power of a laser diode, said method comprising the steps of:
   acquiring a characteristic signal, said characteristic signal including two levels of output power emitted by said laser diode;
   accessing recorded characteristic parameters of said laser diode; and
   driving said laser diode with current on the basis of said characteristic signal and said characteristic parameters.

16. The method of claim 15, wherein the two levels of power are the maximum output power and the minimum output power emitted by said laser diode.

17. The method of claim 16, wherein the recorded characteristic parameters of said laser diode are the mean output power and the difference between the maximum output power and minimum output power stored as a function of drive current and of temperature.

* * * * *